United States Patent [19]

McCasland

[11] Patent Number: 6,100,679
[45] Date of Patent: *Aug. 8, 2000

[54] VOLTAGE INDICATING INSTRUMENT

[75] Inventor: Thomas A. McCasland, Englewood, Colo.

[73] Assignee: Tasco, Inc., Englewood, Colo.

[ * ] Notice: This patent issued on a continued prosecution application filed under 37 CFR 1.53(d), and is subject to the twenty year patent term provisions of 35 U.S.C. 154(a)(2).

[21] Appl. No.: 08/715,179

[22] Filed: Sep. 17, 1996

[51] Int. Cl.[7] .......................... G01R 19/155; G01R 31/02
[52] U.S. Cl. ......................... 324/72.5; 324/556; 324/133; 324/149
[58] Field of Search .................................. 324/508, 555, 324/556, 72.5, 133, 149, 754

[56] References Cited

U.S. PATENT DOCUMENTS

| | | | |
|---|---|---|---|
| 2,710,397 | 6/1955 | Foster | 341/169 |
| 3,829,776 | 8/1974 | Lozoya | 324/122 |
| 3,831,089 | 8/1974 | Pearce | 324/122 |
| 4,004,223 | 1/1977 | Cohen | 324/62 |
| 4,027,236 | 5/1977 | Stewart | 324/556 |
| 4,205,264 | 5/1980 | Gold | 324/51 |
| 4,225,817 | 9/1980 | Kahlden | 324/133 |
| 4,233,560 | 11/1980 | Blenman | 324/133 |
| 4,614,940 | 9/1986 | Jaeckle | 340/636 |
| 4,724,382 | 2/1988 | Schauerte | 324/133 |
| 5,065,142 | 11/1991 | Green | 340/660 |
| 5,105,181 | 4/1992 | Ross | 340/657 |
| 5,202,640 | 4/1993 | Schaaf | 324/537 |
| 5,274,336 | 12/1993 | Crook | 324/690 |
| 5,285,163 | 2/1994 | Liotta | 324/508 |
| 5,642,052 | 6/1997 | Earle | 324/556 |

*Primary Examiner*—Glenn W. Brown
*Attorney, Agent, or Firm*—William E. Hein

[57] ABSTRACT

A tool for indicating the presence of potentially dangerous voltages to the user includes circuitry for detecting the presence of an AC voltage on a blade or other operative portion of the tool, circuitry for filtering and processing the detected AC voltage, and a display for indicating the detected AC voltage to the user.

7 Claims, 1 Drawing Sheet

VOLTAGE INDICATING INSTRUMENT

BACKGROUND AND SUMMARY OF THE INVENTION

This invention relates generally to a device to indicate the presence of potentially dangerous voltages on electrical connections in contact with a tool or other instrument and also to indicate the presence of voltage on a conductor or electrical circuit.

Voltage indicating meters have long been available for testing circuits for the presence of potentially dangerous voltages. More recently, non-contact AC voltage detectors such as the Greenlee Model 38888 have been available. Such devices are only useful if the operator is willing to take the extra time required to test the circuit before working on it. A further problem with these prior art non-contact indicators is that they indicate the presence of an electrical field without contacting a conductor. Thus, there is no way to distinguish which of several adjacent conductors is producing the sensed electrical field. Other voltage indicating devices, such as that described in U.S. Pat. No. 4,724,382 are relatively complex involving high amplification and a constant voltage source to differentiate between full alternating voltage in the main and ripple voltages.

It is therefore a principal object of the present invention to provide a device internal to an electrical tool to alert the user to the presence of potentially dangerous voltages.

It is a further object of the present invention to provide a device for indicating the presence of potentially dangerous voltages to the user without requiring any electrical contact with the user, thereby eliminating the need for protective resistors, foil, and electrodes to insure the user's safety.

It is a further object of the present invention to provide a totally self-contained and waterproof device for indicating the presence of potentially dangerous voltages to the user, thereby eliminating external switches, lights, electrodes, foil, and contacts.

It is yet another object of the present invention to provide a device for indicating the presence of potentially dangerous voltages to the user, the device drawing sufficiently low power from its power source to allow continuous operation for several years without the need to change batteries or disconnect the power source when not in use, thereby insuring against use of the device while inoperative.

These objects are accomplished in accordance with the illustrated preferred embodiment of the invention by providing means for detecting the presence of an AC voltage on a blade or other operative portion of the tool, means for filtering and processing the detected AC voltage, and means for indicating the detected AC voltage to the user.

DESCRIPTION OF THE PREFERRED EMBODIMENT

Figure 1:
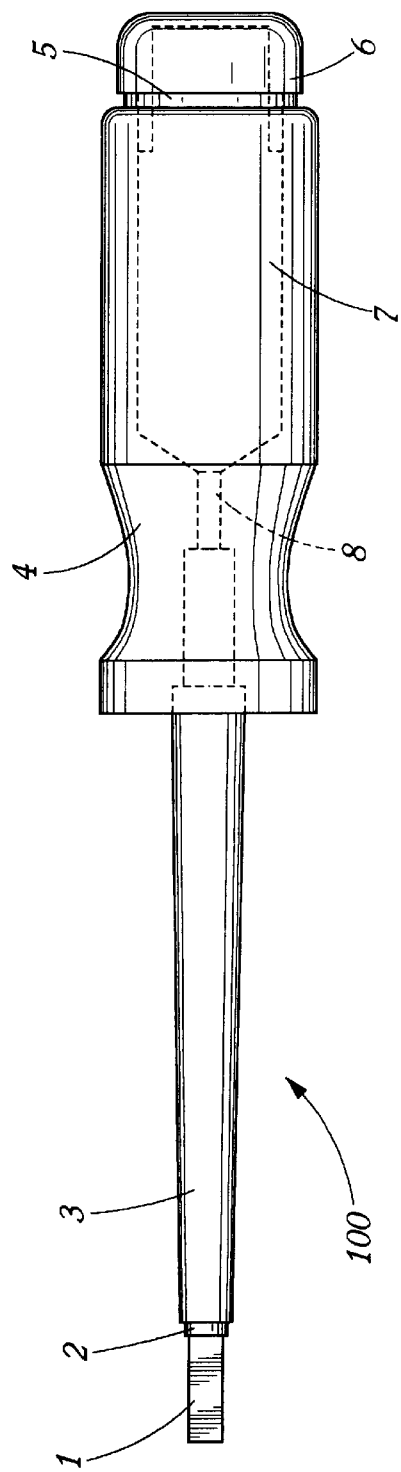
FIG. 1 is a pictorial diagram illustrating the voltage indicating tool of the present invention in the form of a screwdriver.

Referring now to the pictorial diagram of FIG. 1, there is shown an embodiment of an insulated electrician's screwdriver 100 that includes a blade 1 coated with insulation layers 2 and 3. The blade 1 is fixedly retained within a handle portion 4. Handle 4 may be fabricated to be transparent or translucent with a cavity 7 to contain the circuitry of FIG. 2. An opening 8 within handle 4 facilitates connection of this circuitry to the blade 1. An end cap 6 is arranged to cover an opening in the end of handle 4 using a waterproof seal 5.

Figure 2:
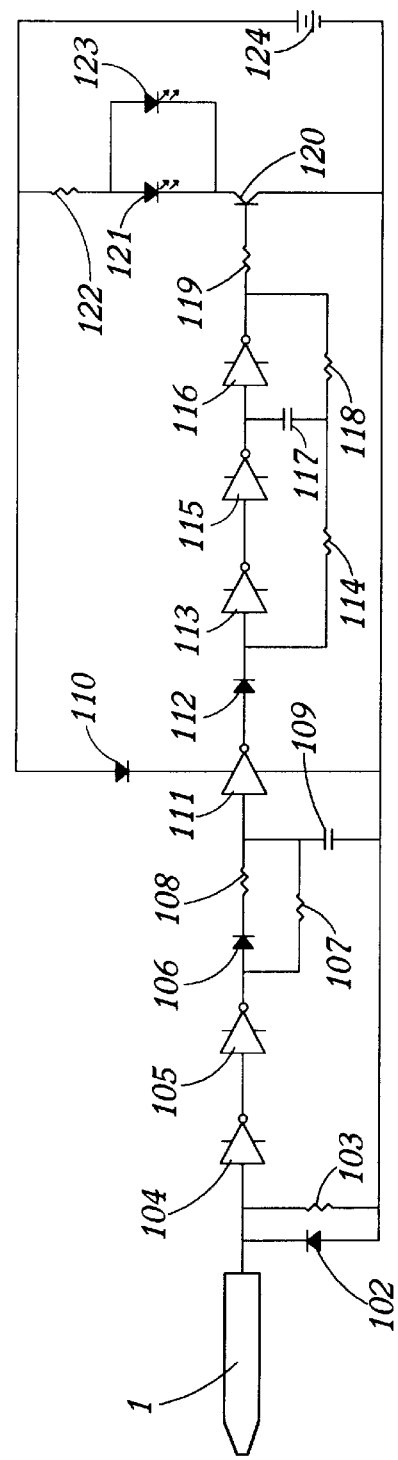
FIG. 2 is a schematic diagram of electronic circuitry employed in the voltage indicating tool of FIG. 1.

Referring now to FIG. 2, there is shown a schematic diagram of the circuitry employed in the voltage indicating tool of FIG. 1. The blade 1 of screwdriver 100 of FIG. 1, used to contact the electrical circuit being tested for the presence of voltage, is connected to the input of an inverter gate 104. A protection diode 102 and a gain limiting resistor 103 are also connected to inverter gate 104 and serve to prevent spurious or electrostatic signals from being detected. An inverter gate 104 serves to invert the signal to a delay circuit comprising a delay diode 106, a delay resistor 108, and a delay capacitor 109. The delay circuit is employed to limit the signal on the input of an inverter gate 111 so that several cycles of an input signal are required to produce an output from inverter gate 111 to thereby prevent interference from spurious signals or noise spikes. A discharge resistor 107 serves to discharge the delay circuit when no signal is present. The various inverters are powered through a protection diode 110, which prevents damage to an inverter in the event the polarity of a battery 124 is reversed. A control diode 112 is reverse biased to allow an oscillator circuit comprising inverters 113, 115, and 116 and resistors 114 and 118 to oscillate when an input signal is present. The oscillator is set to oscillate at a low frequency to cause the voltage indicating tool to emit a flashing light within a frequency range of 2–10 Hertz. The output of the oscillator circuit is fed through a current limiting resistor 119 to a driver transistor 120. The driver transistor 120 drives a pair of LED indicators 121 and 123 through a current limiting resistor 122, resulting in the flashing of the LED indicators whenever an AC voltage is applied to blade 1. The circuitry of FIG. 2, as described hereinabove, draws only a few microamperes of current from battery 124 when not in use.

Several modifications may be made to the invention as described. For example, LED indicators 121 and 123 may be replaced by an incandescent bulb or an audible alarm, while the various inverters may be replaced with transistors or non-inverting gates, and blade 1 could be replaced with a nut driver, probe, pliers or other tool.

What is claimed is:

1. A voltage indicating tool for detecting an AC voltage impressed on an electrically conductive surface, the tool comprising:

an electrically conductive probe member for contacting the electrically conductive surface;

a voltage detection circuit, connected to the probe member, for detecting the AC voltage when the probe member comes in contact with the electrically conductive surface;

an amplifying circuit connected to the voltage detection circuit;

a signal conditioning circuit connected to the amplifying circuit, the signal conditioning circuit comprising a delay circuit for delaying an indication of the AC voltage until a plurality of cycles of the AC voltage have been detected to thereby eliminate false indications that would otherwise result from detection of spurious signals and noise spikes accompanying the AC voltage, and a reset circuit for resetting the delay circuit after the AC voltage has been removed for a predetermined period of time; and a voltage indicator connected to the signal conditioning circuit for indicating the presence of the detected AC voltage to the user.

2. A voltage indicating tool as in claim 1 wherein the amplifying circuit includes a gain limiting resistor for varying the range of AC voltages which may be detected.

3. A voltage indicating tool as in claim 2 wherein the amplifying circuit further includes an inverter gate across which the gain limiting resistor is connected.

4. A voltage indicating tool as in claim 1 further comprising an internal power source connected to said voltage detection circuit, said amplifying circuit, said signal conditioning circuit, and said voltage indicator for supplying operating power thereto.

5. A voltage indicating tool as in claim 1 wherein the voltage indicator is operative for providing a visual indication to the user of the presence of the detected AC voltage.

6. A voltage indicating tool as in claim 5 wherein the visual indication flashes at a predetermined frequency.

7. A method for detecting and indicating an AC voltage impressed on an electrically conductive surface, the method comprising:

providing a tool having an electrically conductive probe member;

contacting the electrically conductive surface with the probe member;

detecting the AC voltage when the probe member comes in contact with the electrically conductive surface; and indicating the presence of the detected AC voltage only after a plurality of cycles of the AC voltage have been detected to thereby eliminate false indications that would otherwise result from detection of spurious signals and noise spikes accompanying the AC voltage.

* * * * *